United States Patent
Aichriedler et al.

(10) Patent No.: US 12,306,240 B2
(45) Date of Patent: May 20, 2025

(54) GATE CHARGE AND LEAKAGE MEASUREMENT TEST SEQUENCE FOR SOLID STATE DEVICES

(71) Applicant: Infineon Technologies Austria AG, Villach (AT)

(72) Inventors: Leo Aichriedler, Puch (AT); Gerald Wriessnegger, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 250 days.

(21) Appl. No.: 17/961,101

(22) Filed: Oct. 6, 2022

(65) Prior Publication Data

US 2024/0118334 A1 Apr. 11, 2024

(51) Int. Cl.
*G01R 31/26* (2020.01)
*G08B 21/18* (2006.01)

(52) U.S. Cl.
CPC ....... *G01R 31/2621* (2013.01); *G08B 21/185* (2013.01)

(58) Field of Classification Search
CPC ............ G01R 31/2621; G08B 21/185
See application file for complete search history.

(56) References Cited

U.S. PATENT DOCUMENTS

| 4,835,458 A * | 5/1989 | Kim | G01R 31/2621 257/E27.098 |
|---|---|---|---|
| 2014/0043058 A1 | 2/2014 | Onishi | |
| 2021/0080498 A1 | 3/2021 | Tadepalli et al. | |

FOREIGN PATENT DOCUMENTS

| CN | 107807319 A | 3/2018 | |
|---|---|---|---|
| WO | WO-2019033237 A1 * | 2/2019 | ............... H02H 3/00 |

OTHER PUBLICATIONS

Gupta, Sourav, IGBT-Insulated Gate Bipolar Transistor, Mar. 23, 2019, Circuit Digest, p. 1 (Year: 2019).*
European Search Report from Corresponding European Patent Application No. 23201609.7, 9 pages.
Peter B. Green, et al., "Gate drive for power MISFETs in switching applications A guide to device characteristics and gate drive techniques", Apr. 20, 2022, XP093125972, https://www.infineon.com/dgdl/Infineon-Gate_drive_for_power_MOSFETs_in_switchin_applications-ApplicationNotes-v01_00-EN.pdf?fileld=8ac78c8c80027ecd0180467c871b3622.

* cited by examiner

*Primary Examiner* — Nabil H Syed
*Assistant Examiner* — Cal J Eustaquio
(74) *Attorney, Agent, or Firm* — Cooper Legal Group LLC

(57) ABSTRACT

An apparatus comprises a switch and a capacitor connected to the switch and to a gate driver that drives a gate of a solid state device. The gate driver is operated to perform a test sequence for the solid state device. The test sequence includes turning on a switch and charging a capacitor to a supply voltage during an initial phase. During a first phase, the switch and the solid state device are turned off, the gate driver is disconnected from the supply voltage, and the gate driver drives the gate of the solid state device based at least upon a charge of the capacitor. During a second phase, the gate driver drives the gate of the solid state device to turn on the solid state device. A gate charge at the gate of the solid state device is measured as an operational state of the solid state device.

20 Claims, 6 Drawing Sheets

GATE CHARGE AND LEAKAGE MEASUREMENT TEST SEQUENCE FOR SOLID STATE DEVICES

TECHNICAL FIELD

The present disclosure relates to the field of gate charge and leakage measurements for solid state devices.

BACKGROUND

Solid state devices, such as solid state switches, are used in various applications such as in circuit breakers, e-Fuses, etc. In these types of applications, the solid state devices may turn off and/or close to stop conducting if there is an abnormal condition such as an overload or short circuit.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, an apparatus is provided. The apparatus comprises a switch and a capacitor connected to the switch and to a gate driver that drives a gate of a solid state device. The gate driver is operated to perform a test sequence for the solid state device. The test sequence includes turning on a switch and charging a capacitor to a supply voltage during an initial phase. During a first phase, the switch and the solid state device are turned off, the gate driver is disconnected from the supply voltage, and the gate driver drives the gate of the solid state device based at least upon a charge of the capacitor. During a second phase, the gate driver drives the gate of the solid state device based to turn on the solid state device. A gate charge at the gate of the solid state device is measured as an operational state of the solid state device.

In an embodiment of the techniques presented herein, a method is provided. The method includes charging a capacitor using a supply voltage while a switch is turned on. A gate driver coupled to a gate of a solid state device is controlled to turn off the solid state device. The switch is turned off after the capacitor has reached a charged condition. The capacitor is connected to the gate driver and the switch. The solid state device is driven with the gate driver based upon a charge of the capacitor while the solid state device and the switch are turned off and the gate driver is disconnected from the supply voltage during a first phase of a test sequence. The solid state device is turned on, during a second phase of the test sequence, by driving the solid state device. During the second phase while the solid state device is on, a gate charge of the gate of the solid state device is measured as an operational state of the solid state.

In an embodiment of the techniques presented herein, an apparatus is provided. The apparatus comprises a means for charging a capacitor using a supply voltage while a switch is turned on. The apparatus comprises a means for controlling a gate driver coupled to a gate of a solid state device to turn off the solid state device. The apparatus comprises a means for turning off the switch after the capacitor has reached a charged condition, where the capacitor is connected to the gate driver and the switch. The apparatus comprises a means for driving the solid state device with the gate driver based upon a charge of the capacitor while the solid state device and the switch are turned off and the gate driver is disconnected from the supply voltage during a first phase of a test sequence. The apparatus comprises a means for turning on, during a second phase of the test sequence, the solid state device by driving the solid state device. The apparatus comprises a means for measuring, during the second phase while the solid state device is on, a gate charge of the gate of the solid state device as an operational state of the solid state device.

In an embodiment of the techniques presented herein, an apparatus is provided. The apparatus comprises a solid state device. The apparatus comprises a switch connected between a voltage source for a gate driver and a gate driver output supply pin. The apparatus comprises a capacitor connected to the gate driver and the switch, wherein the capacitor is charged to a supply voltage while the switch is turned on. The apparatus comprises the gate driver configured to drive a gate of the solid state device. A test sequence is performed. A first phase of the test sequence is performed where the solid state device is turned off and the gate driver drives the gate of the solid state device based at least upon a charge of the capacitor. A second phase of the test sequence is performed where the switch is turned on and the gate driver drives the gate of the solid state device to turn on the solid state device, and where a gate charge at the gate of the solid state device is measured as an operational state of the solid state device. A third phase of the test sequence is performed where a gate leakage current of the gate is measured as the operational state based upon a change in an output voltage of the gate driver over time.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 10 is a component block diagram illustrating a second phase of measuring gate charge and leakage for a solid state device in accordance with at least some of the techniques presented herein.

DETAILED DESCRIPTION

Figure 1A:
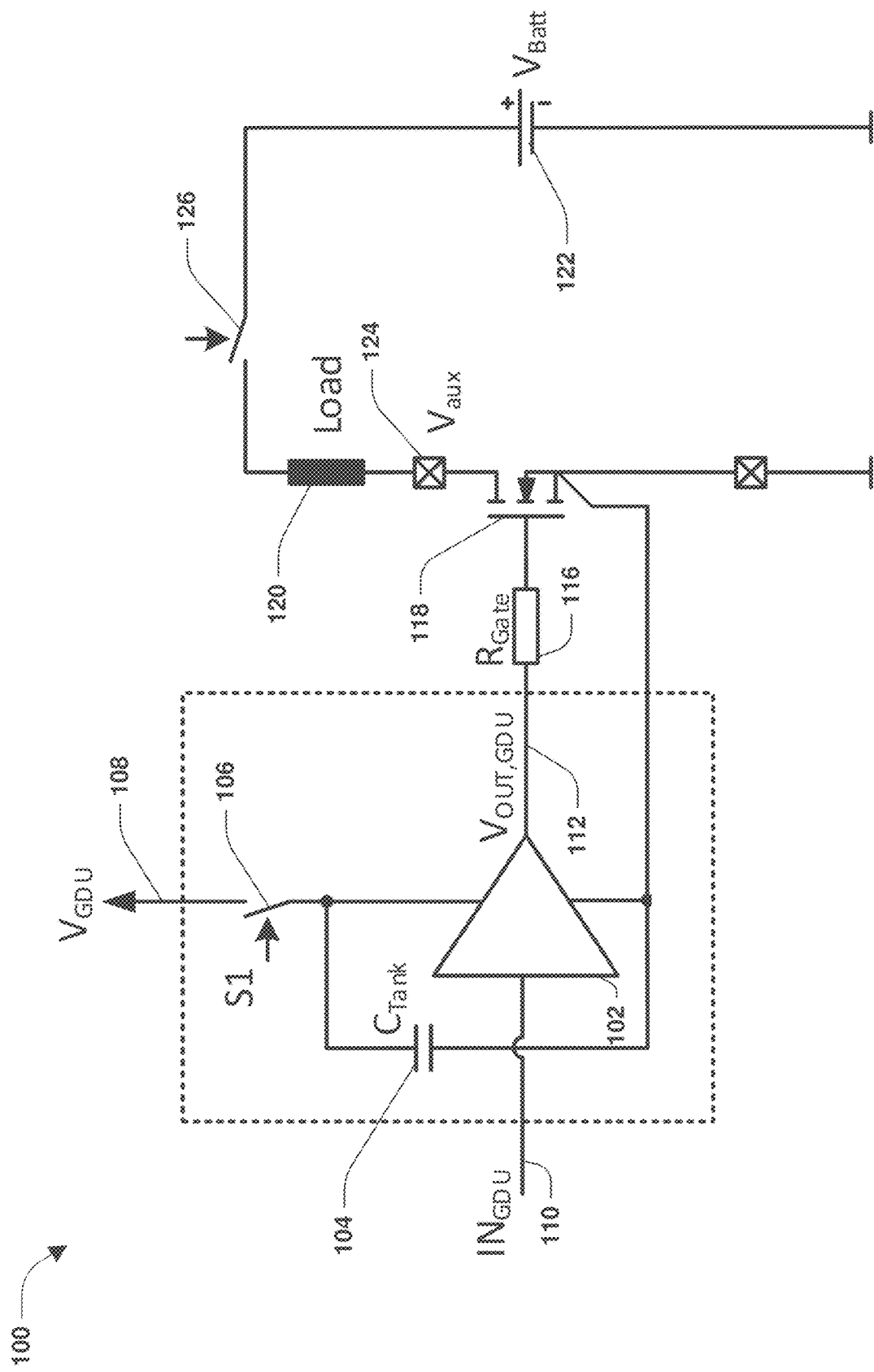
FIG. 1A is a component block diagram illustrating an apparatus for measuring gate charge and leakage for a solid state device in accordance with at least some of the techniques presented herein.
Figure 1B:
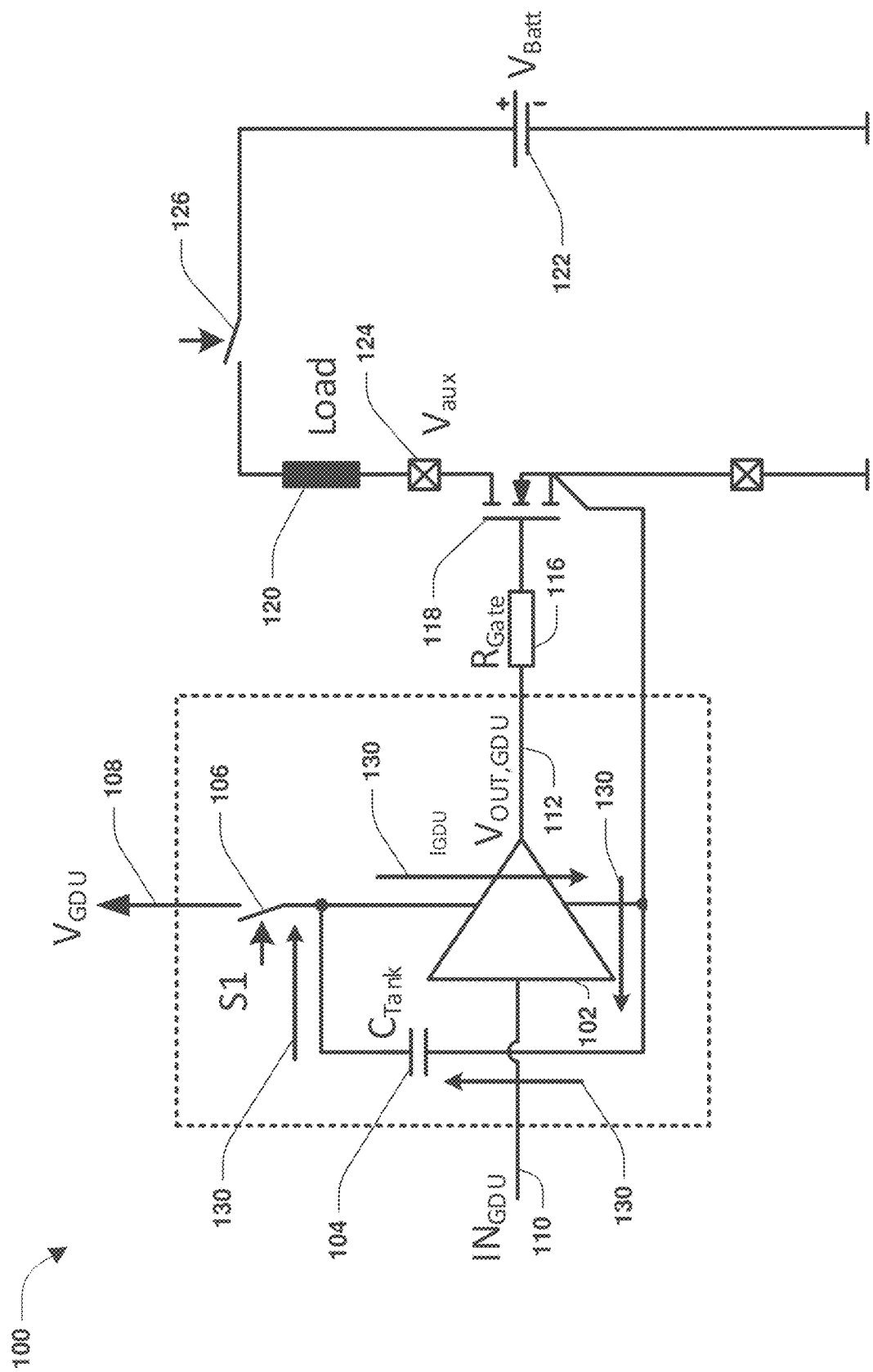
FIG. 1B is a component block diagram illustrating a first phase of measuring gate charge and leakage for a solid state device in accordance with at least some of the techniques presented herein.
Figure 1C:
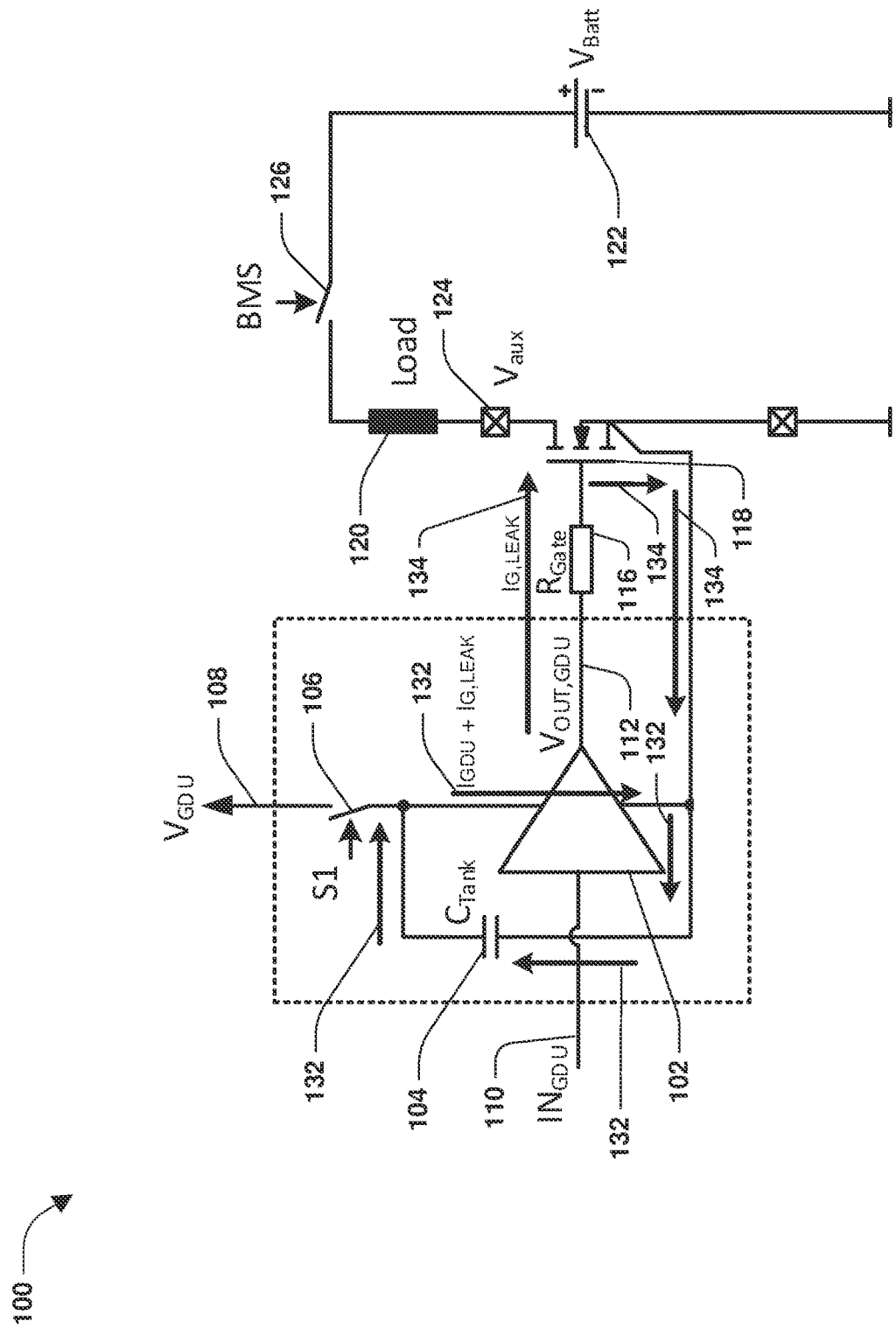

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Various devices, such as e-Fuses and circuit breakers, may utilize solid state devices that operate in either an on state or an off state. These solid state devices may comprise solid state switches, metal-oxide-semiconductor field-effect transistors (MOSFETs), etc. A solid state device may transition from one of the states to another state based upon a voltage applied to a gate of the solid state device. Once the voltage of the gate reaches a threshold voltage Vth, then the solid state device may change states, such as where the solid state device is turned on and starts conducting. In certain applications, the solid state device may remain in a particular state for an extended period of time. This period of time could be years, such as where a solid state device of a circuit breaker is in an on state until an abnormal condition of an electric supply network occurs such as an overload or short circuit. Because the solid state device remains in one state for such a long period of time, there is no way to verify that the solid state device is operating correctly and will be able to transition states when needed such as to safely turn off when the abnormal condition occurs. This can lead to catastrophic failures and damage.

The health and operability of the solid state device may deteriorate over time due to various reasons such as stress on the solid state device. One issue is where residual failed solid state switch circuits can potentially end up as high leakage or even shorted devices. The failure can be caused by a power device or a control circuit for the power device. For many implementations such as circuit breakers, fuses, or simple switches, these types of failures can be dangerous because a faulted output stage can lead to severe damage. Thus, it is necessary to provide efficient counter measures to prevent critical failures in control circuits from propagating into a power stage, and to perform in-situ (e.g., during operation) state of health diagnostics of both the control circuit and the power stage to detect critical failures and enable the system to transition into a safe state.

For MOS power devices, the integrity of a gate block comprising gate oxide and the connection of the physical gate structure to a gate driver output is where multiple critical failure effects can occur. For example, an unintended increase of an on-state resistance (RDSon) can occur due to insufficient gate overdrive. Due to additional power losses, cooling of the power device may not be sufficient anymore. This could cause fatal damage to the system, even during normal operating conditions. Insufficient gate overdrive not only increases the RDSon of the affected device but potentially causes the power device to operate in a linear mode. Advanced high density power transistors do not support this mode of operation since this may lead to secondary breakdowns (current filamentation effects) within the transistor. In case of paralleled devices, a failure at a gate connection of one power device will increase the load on all other power devices causing potential overload of the remaining power devices. Due to capacitive coupling effects, disconnected gate pins are basically floating. Therefore the output state of a transistor with a floating gate is undefined and potentially causes an unintended turn-on.

Since the severity of the resulting failures is very high, safety critical implementations such as power switches used for circuit breakers or eFuses require the monitoring of the state-of-health condition of all power devices and their control circuit. This detection must be performed in-situ (during operation), with the apparatus connected to the application circuit. Conventional monitoring techniques are inaccurate and provide low monitoring resolution that is insufficient to detect critical drifts of gate properties as an early problem indicator, and cannot detect loss of gate control in multi-transistor output stages. Other conventional solutions have very high cost and still provide insufficient performance such as where high performance operational amplifiers must be utilized.

With a typical gate charge measurement circuit for a device under test solid state device (e.g., a MOSFET), an effective total gate charge consists of a charge of the gate-source capacitance (QGS) and a gate-drain capacitance (QGD). A switch is connected between a gate and a source of the solid state device. In some embodiments, a gate resistance is 2.2 Ohm at sink and 22 Ohm at source. As soon as the switch is opened, a gate of the solid state device is charged by a gate charge current IG, and a gate-source voltage (VGS) starts to rise. Further increase of the gate-source voltage (VGS) will increase a drain current flowing thru the solid state device. When the solid state device's drain current reaches a load current level, the solid state device's drain voltage starts to decrease, and thus the gate charge current IG is now mainly charging the gate-drain capacitance. When the solid state device's drain voltage reaches a steady-state operating point defined by Ron*Iload, the gate voltage is finally charged to its steady-state value defined by the gate driver. In high current switching applications the gate charging procedure has to be executed as quickly as possible to minimize the switching losses as well as to ensure that the operation of the device is within its safe operating area (SOA). This is done by increasing the gate current IG in order to charge the gate very quickly (typically <1 µs). This test setup is not applicable for an in-situ measurement (e.g., measurement while the system is operational) since gate drivers are typically implemented by a push-pull output stage featuring a low-resistance output to the gate driver supply voltage. A gate current limitation is typically implemented by tuning the gate driver's output impedance and/or by introducing series resistors.

Accordingly, the techniques provided herein implement a gate charge and leakage measurement test sequence, which may be implemented as a gate driver feature and/or performed in-situ (e.g., during operation). The gate charge and leakage measurement test sequence can be implemented for circuits such as electronic fuses, smart circuit breakers, or other types of circuits to enable a highly efficient built-in self-test of MOS power devices by analyzing the effective gate charge and gate leakage of solid state devices (e.g., transistors and/or transistor assemblies). In order to implement the gate charge and leakage measurement test sequence, a series switch is included within a gate driver's power supply (e.g., added into an output stage supply of the gate driver), which provides for a temporary disconnect for a supply pin from a power supply (e.g., a DC power supply). During a disconnection phase, the gate driver is exclusively supplied through a capacitor (e.g., a bypass capacitor tank (Ctank) (e.g., 470 nF, 25V, 10%; 470 nF, 100V, 10%; etc.). During normal operation, the switch is closed and the gate driver is supplied by a supply voltage for the gate driver (VGDU) (e.g., 14V or some other voltage). The capacitor is used as a decoupling capacitor in order to stabilize VGDU for the gate driver. In some embodiments, a current of the gate driver (IGDU) is 440 uA or some other value. The input signal of the gate driver unit (INGDU) is used to switch a solid state device under test (e.g., a transistor device under test) on or off. For initiating the gate charge and leakage measurement test sequence, the solid state device is commanded into off state (e.g., where VGS=0V, where VGS is around 12V or some other value when on). The switch is opened after reaching a steady-state charging condition of the capacitor. The gate driver will then be solely supplied from the capacitor, which causes the voltage at the capacitor (CTank) to decrease. This decrease is proportional to the supply current of the gate driver: IGDU=CTank·dVTank dt.

Next, the solid state device is turned on by the gate driver. Since the supply connection via the switch is still open, the total gate charge (Qg) for switching of the solid state device will be solely provided from the capacitor. As the turn-on is done very fast, a voltage drop is representing the gate charge QG of the solid state device: QG=CTank·Vout,drop.

When the power device is in the steady On-state, the remaining current flow from the gate driver is the supply current and the gate-leakage current of the device: Idischarge=IGDU+IG,leakage=CTank·dVout,GDU dt. By sampling VGDU, both a total gate charge of the solid state device as well as the gate leakage currents can be evaluated by voltage measurements where Vout,drop is directly proportional to the connected effective gate charge Qg, and dVout,drop/dt is directly proportional to the gate driver supply current plus the gate leakage current. In some embodiments, a normal leakage is 100 uA and a high leakage is 300 uA. In some embodiments, a normal slew rate is 0.2V/ms and a high leakage slew rate is 0.6V/ms.

This technique provides high sensitivity on measuring the gate leakage currents (including a passive gate bleed circuit) and connection status of all solid state devices (transistors). In some embodiments, a potential disconnection of one out of three power transistors would change Vout,drop from 1,673V to 1,212V (27%), which can be easily and safely evaluated by this technique using ADC measurements. The technique can be applied to multiple solid state applications, covering both quasi static and continuous switching implementations.

In some embodiments, this technique may be utilized for electronic DC fuses (e-Fuse) for automotive and industrial use. For automotive use, a solid state device e-Fuse is part of a complex infrastructure that typically features a serial connection of two or more switches. One switch is used to provide a disconnect unit for the entire boardnet, such as a battery main switch (BMS), while the other switch provides a selective connect/disconnect function for parts/sub-branches of the electric powertrain. In this use case, the state-of-health diagnostics of the eFuse power element can be performed during a vehicle startup-sequence. In this state, the battery main switch (BMS) is in an open condition and the powertrain supply network is completely discharged. Therefore the eFuse power transistor can be tested by applying this gate charge and leakage measurement test sequence without activation of any load. When the switch test sequence has been executed successfully, the powertrain is enabled using a control unit by closing the battery main switch (BMS). During a drive cycle, the eFuse's power transistor has to be kept in an on state. During this operation mode, the gate charge and leakage measurement test sequence is reduced to periodic measurements of the gate leakage current. This is performed by periodically opening the switch for a short time and measuring the voltage decay during this period (e.g. topen=5 ms at Tperiod=100 ms). The change in the supply voltage directly represents the gate leakage current. When the drive cycle is completed (power down cycle), another complete gate charge and leakage measurement test sequence, as described in the startup sequence, is executed while the battery main switch (BMS) is opened.

In some embodiments, this technique may be utilized for an AC breaker switch (a smart circuit breaker). Similar to eFuses, AC switch implementations (e.g., for circuit breakers) require similar transistor state-of-health diagnostics due to safety requirements. While automotive drive cycles are typically limited to several hours, AC switch activation cycles can range from several periods of the main's frequency up to several years without any change of state (e.g., a circuit breaker may not trip for several years). In some embodiments, series switches may not be present. While the leakage current measurement can be performed at any time during the operation phase (e.g. over one full period of the AC voltage), the gate charge and leakage measurement test sequence for evaluating the gate charge is executed during a zero crossing of the current. In this case, no additional series switch is needed and the diagnosis of the gate can be performed in-situ during normal operation without any interruption of a load supply.

This innovation provides a diagnostic feature for a gate driver to enable a highly efficient in-situ diagnostic of gate charge and gate leakage properties of power stages comprising one or more solid state devices (e.g., power transistors). The diagnostic feature disconnects a power supply of the gate driver temporarily and uses a buffer capacitor to supply charge to the gate driver during this phase. During a diagnostic sequence, no current is present at the solid state device. Next, the solid state device is turned on by the gate driver. A voltage across the buffer capacitor will be monitored and is representing the gate charge and gate leakage. The gate charge can be calculated by a voltage drop during turn on of the solid state device, while the gate leakage is represented by the voltage drop over time in steady state condition. Because of the buffer capacitance, the gate charge and leakage can be calculated.

This innovation provides various benefits over conventional testing mechanisms. In particular, power transistors with gate charge or leakage drifts can be detected before a catastrophic failure (e.g., destruction of device and failure propagation) occurs. In the case of paralleled transistor assemblies, single transistor disconnects can be selectively detected. The reduced (catastrophic) failure rate enables the use of these power devices in safety critical or high availability applications. Early drift detection allows for a limited time of continued operation (e.g. limp-home mode) with or without degraded performance before the defective device requires exchange.

FIG. 1A is a component block diagram illustrating an apparatus 100 for measuring gate charge and leakage for a solid state device 118 in accordance with at least some of the techniques presented herein. The apparatus 100 comprises the solid state device 118, such as a transistor, a power switch, etc. The solid state device 118 may be connected to a load 120. The load 120 may be connected to a power source (Vbatt) 122. There may be an auxiliary voltage (Vaux) 124 between the load 120 and the solid state device 118. A main switch 126 (e.g., a battery main switch (BMS)) may be located between the load 120 and the power source (Vbatt) 122 such that the main switch 126 can be used to connect and disconnect the load 120 from the power source (Vbatt) 122.

A gate driver 102 is configured to drive a gate of the solid state device 118. The gate of the solid state device 118 has a gate resistance (Rgate) 116. The gate driver 102 applies a voltage (Vout,gdu) 112 to the gate of the solid state device 118 to turn on and off the solid state device 118. The gate driver 102 operates based upon an input current (INgdu) 110. A switch (S1) 106 is used to connect the gate driver 102 to a voltage source (Vgdu) 108 for the gate driver 102. In some embodiments, the switch (S1) 106 is integrated into the gate driver 102. In some embodiments where the switch (S1) 106 is not integrated into the gate driver 102, the switch (S1) 106 is connected between the voltage source (Vgdu) 108 for the gate driver 102 and a gate driver output supply pin. A capacitor (Ctank) 104 is connected to the switch (S1) 106 and the gate driver 102.

The gate driver 102 is configured to perform a test sequence (a gate charge and leakage measurement test sequence) for the solid state device 118 to detect an operational state of the solid state device 118. In some embodiments where the solid state device 118 is part of a DC current carrying solid state component (e.g., a DC eFuse), the test sequence may be performed during at least one of a power up or a power down cycle. In some embodiments where the solid state device is part of an AC breaker, the test sequence is performed during a zero-crossing of AC current detected by a current sensor associated with the AC breaker. In some embodiments, the test sequence is performed for a pair of solid state devices, which will be further described in relation to FIG. 2. The pair of solid state devices may be configured in parallel, and the test sequence may be performed to selectively detect a disconnection of a solid state device of the pair of solid state devices. In some embodiments, the test sequence is performed in-situ during operation of the apparatus 100 comprising the solid state device 118, such as where the apparatus 100 is deployed and operational (e.g., during a power up/down sequence of a vehicle boardnet of a vehicle).

As part of performing the test sequence, an initial phase of the test sequence is performed. During the initial phase of the test sequence, the switch (S1) 106 is turned on (closed) in order to connect the capacitor (Ctank) 104 and the gate driver 102 to the voltage source (Vgdu) 108. During the initial phase, the capacitor (Ctank) 104 is charged by the voltage source (Vgdu) 108. Once the initial phase is complete, the switch (S1) 106 is turned off (opened) and a first phase of the test sequence is performed, as illustrated by FIG. 2B illustrating the first phase of measuring gate charge and leakage for the solid state device 118 in accordance with at least some of the techniques presented herein.

During the first phase of the test sequence, the switch (S1) 106 is in the off state (opened) and the solid state device 118 is turned off, which disconnects the gate driver 102 and the capacitor (Ctank) 104 from the voltage source (Vgdu) 108. In some embodiments, the solid state device 118 is turned off 118 because the gate driver 102 is no longer driving the gate of the solid state device 118 using the voltage source (Vgdu) 108 due to the switch (S1) disconnecting the gate driver 102 from the voltage source (Vgdu) 108. The gate driver 102 is applying the voltage (Vout,gdu) 112 to the gate of the solid state device 118 based at least upon a charge of the capacitor (Ctank) 104 that is still connected to the gate driver 102. In particular, a current (Igdu) 130 is induced through the gate driver 102 based at least upon the charge of the capacitor (Ctank) 104. After the first phase of the test sequence, a second phase of the test sequence is performed, as illustrated by FIG. 3C illustrating the second phase of measuring gate charge and leakage for the solid state device 118 in accordance with at least some of the techniques presented herein.

During the second phase of the test sequence, the gate driver 102 drives the gate of the solid state device 118 to turn on the solid state device 118. In some embodiments, the gate driver 102 drives the gate of the solid state device 118 with remaining charge in the capacitor (Ctank) 104. A gate charge at the gate of the solid state device 118 is measured as an operational state of the solid state device 118. The gate charge may be measured based upon a capacitance change (voltage drop) of the capacitor (Ctank) 104 after the solid state device 118 has been switched (e.g., turned on). A voltage drop of the capacitor (Ctank) 104 (capacitance change of the capacitor (Ctank) 104) is proportional to a drop in the output voltage Vout,drop (e.g., a drop in the voltage (Vout,gdu) (112) since the capacitor (Ctank) 104 is the only power source during the second phase.

During a third phase of the test sequence, a gate leakage current (Ig,leak) 134 of the gate of the solid state device 118 is measured as the operational state. In some embodiments, the gate leakage current (Ig,leak) 134 of the gate of the solid state device 118 is measured based upon a change in the output voltage of the gate driver 102 over time (e.g., a change in the voltage (Vout,gdu) 112). In some embodiments, the gate leakage current (Ig,leak) 134 of the gate of the solid state device 118 is measured based upon the supply voltage of the gate driver 102 since a voltage decay of the capacitor (Ctank) 104 is representative of the gate leakage current (Ig,leak) 134. In some embodiments, the gate leakage current (Ig,leak) 134 of the gate of the solid state device 118 is measured based upon a capacitance change of the capacitor (Ctank) 104 because the output voltage of the gate driver 102 (e.g., the voltage (Vout,gdu) 112) is similar to a voltage of the capacitor (Ctank) 104. In some embodiments, the gate leakage current (Ig,leak) 134 of the gate of the solid state device 118 is measured based a discharge capacitance proportional to a current of the gate (Igdu) of the gate driver 102 and the gate leakage current (Ig,leak) 134, represented by Igdu+Ig,leak 132.

In some embodiments, a warning signal is generated based upon the operational state indicating that the solid state device operating in a degraded operational state. The degraded operational state may be identified by comparing the gate leakage current (Ig,leak) 134 to a normal/expected gate leakage current (e.g., 100 uA as a normal gate leakage current and 300 uA as a high gate leakage current). The degraded operational state may be identified by comparing the gate charge at the gate of the solid state device 118, as measured during the second phase of the test sequence, to a normal/expected gate charge (e.g., 0.2V/ms as a normal slew rate and 0.6V/ms as a high slew rate).

In some embodiments, a warning message is generated based upon the operational state indicating a potential future failure of the solid state device 118. The potential future failure may be predicted based upon a comparison of the gate leakage current (Ig,leak) 134 to a threshold (e.g., a threshold between 100 uA as a normal gate leakage current and 300 uA as a high gate leakage current) and/or a comparison of the gate charge at the gate of the solid state device 118 to a threshold (e.g., a threshold between 0.2V/ms as a normal slew rate and 0.6V/ms as a high slew rate). The potential future failure may be predicted based upon historical/trending information of measured gate leakage currents and measured gate charges over time.

Figure 2:
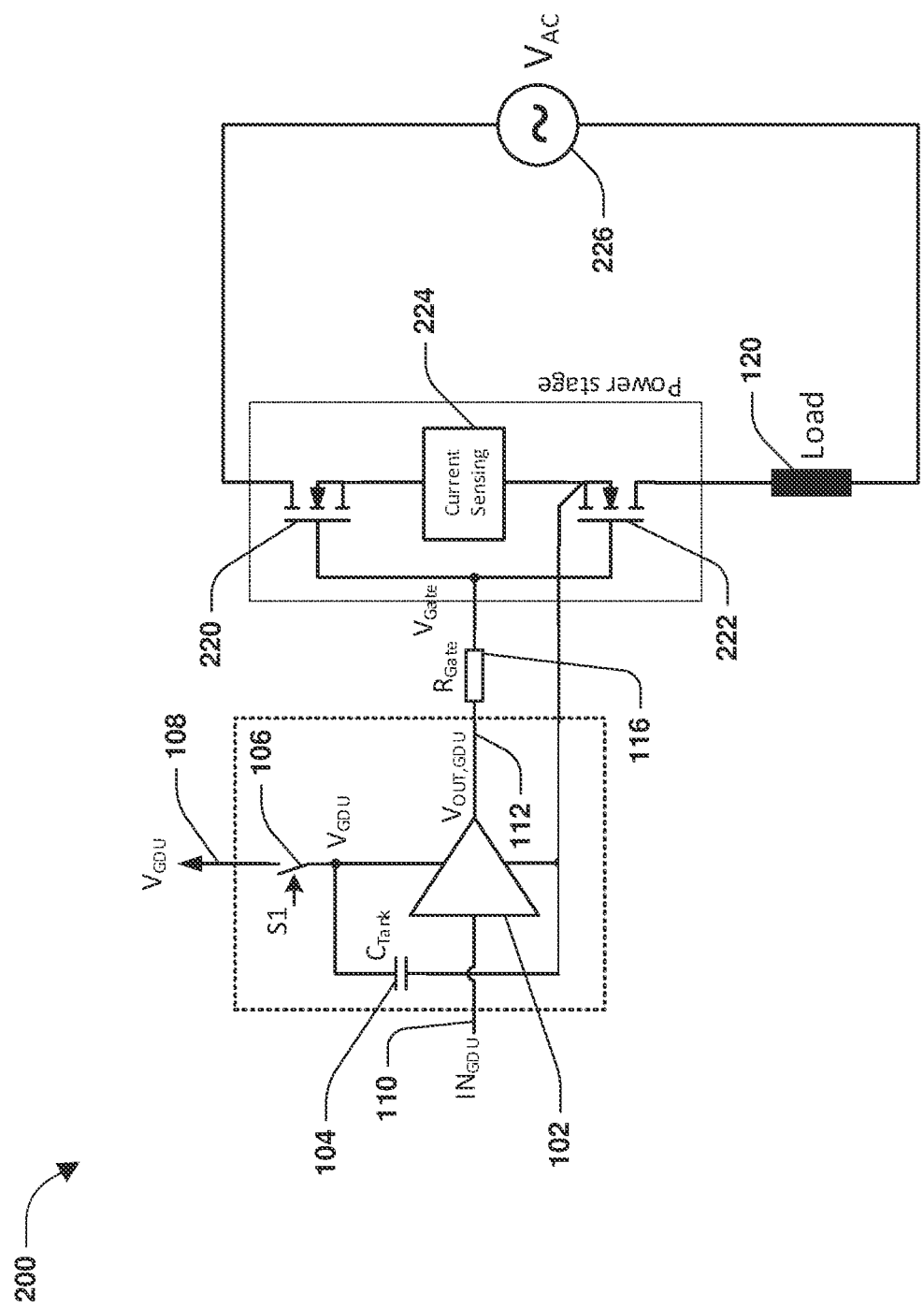
FIG. 2 is a component block diagram illustrating an apparatus for measuring gate charge and leakage for a pair of solid state devices in accordance with at least some of the techniques presented herein.

FIG. 2 is a component block diagram illustrating an apparatus 200 for measuring gate charge and leakage for a pair of solid state devices in accordance with at least some of the techniques presented herein. The apparatus 200 comprises similar components as the apparatus 100, such as the gate driver 102, the capacitor (Ctank) 104, the switch (S1) 106, the voltage source (Vgdu) 108 for the gate driver 102, the input current (INgdu) 110, the voltage (Vout,gdu) 112 as the output voltage of the gate driver 102, the load 120, etc. However, the apparatus 200 includes two solid state devices in parallel, such as a first solid state device 220 and a second solid state device 222 that are powered by an AC voltage source (Vac) 226. Current sensing 224 is provided at a power stage of the apparatus 200. Operational states of the first solid state device 220 and the second solid state device 222 can be performed at a zero-crossing of an AC current from the AC voltage source (Vac) 226 without requiring additional series switches. The operational states can be detected based upon the gate charge and leakage measurement test sequence discussed in relation to FIGS. 1A-C and FIG. 3. The operational states can be used to selectively detect a disconnection of the first solid state device 220 or the second solid state device 222.

Figure 3:
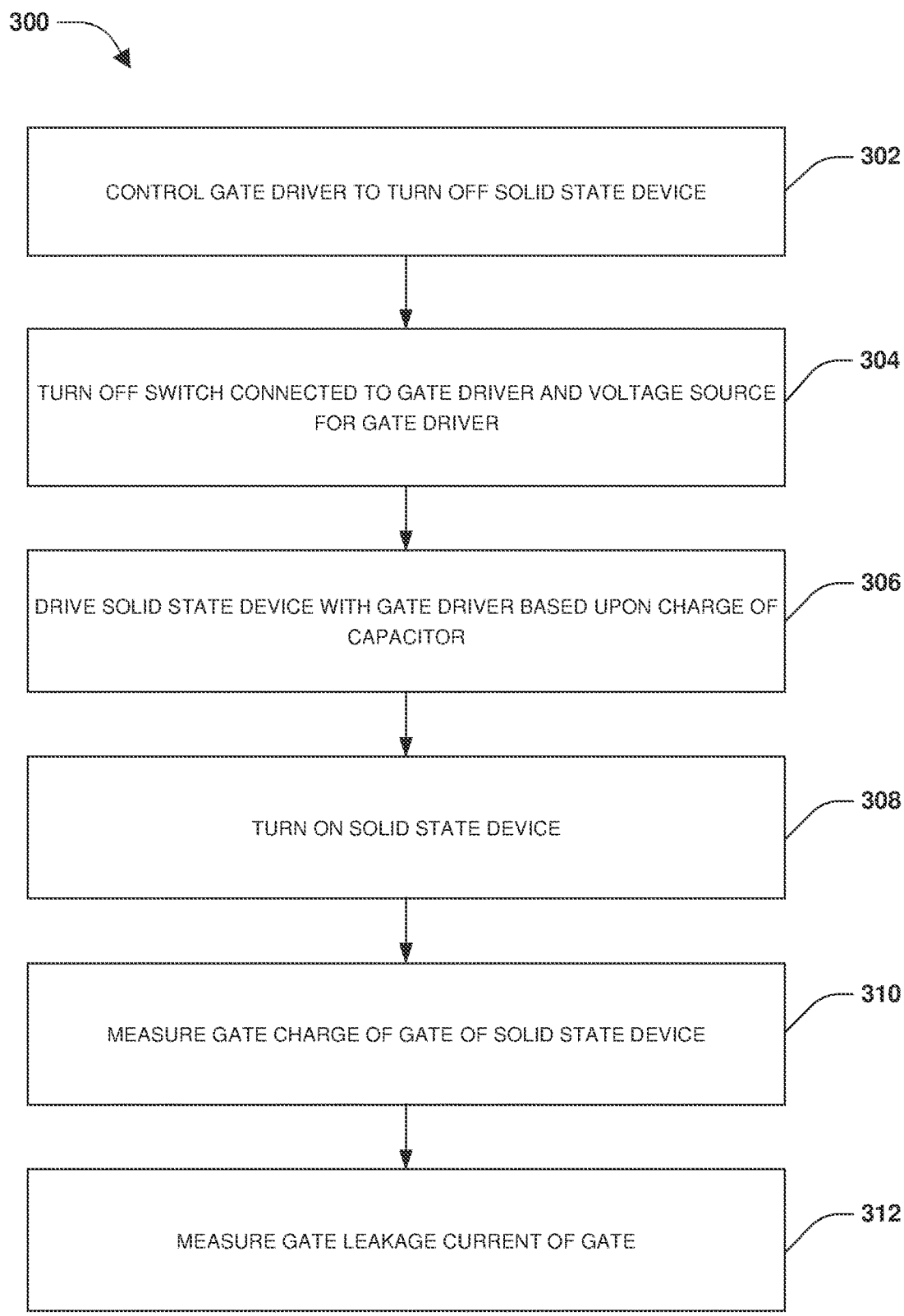
FIG. 3 is an illustration of an example method for performing a gate charge and leakage measurement test sequence for a solid state device in accordance with at least some of the techniques presented herein.

FIG. 3 is an illustration of an example method 300 for performing a gate charge and leakage measurement test sequence for a solid state device in accordance with at least some of the techniques presented herein. During an initial phase of performing the gate charge and leakage measurement test sequence (a test sequence), a capacitor is charged using a supply voltage while a switch is turned on. The switch may be integrated into a gate driver or may be connected between a voltage source (the supply voltage) for the gate driver and a gate driver output supply pin. The gate driver may be coupled to a gate of the solid state device. During operation 302 of method 300, the gate driver may be controlled to turn off the solid state device. During operation 304 of method 300, the switch is turned off after the capacitor has reached a charged condition. The capacitor is connected to the gate driver and the switch. During operation 306 of method 300, the solid state device is driven by the gate driver based at least upon a charge of the capacitor while the solid state device and the switch are turned off and the gate driver is disconnected from the supply voltage during a first phase of the gate charge and leakage measurement test sequence.

During a second phase of the gate charge and leakage measurement test sequence, the solid state device is turned on based upon the gate driver driving the solid state device, during operation 308 of method 300. During the second phase while the solid state device is turned on, a gate charge of the gate of the solid state device is measured as an operational state of the solid state device, during operation 310 of method 300. The gate charge may be measured based upon a voltage drop of the capacitor.

During a third phase of the gate charge and leakage measurement test sequence, a gate leakage current of the gate of the solid state device is measured as the operational state, during operation 312 of method 300. The gate leakage current is measured based upon a change in an output voltage of the gate driver over time or based upon the supply voltage of the gate driver. The operational state may be used to determine whether the solid state device is operating in a degraded operational state. Accordingly, a warning signal may be generated based upon the operational state to indicate that the solid state device is operating in the degraded operational state. The operational state may be used to determine/predict whether the solid state device will potentially fail in the future. Accordingly, a warning signal may be generated based upon the operational state to indicate that the solid state device may potentially fail in the future.

Figure 4:
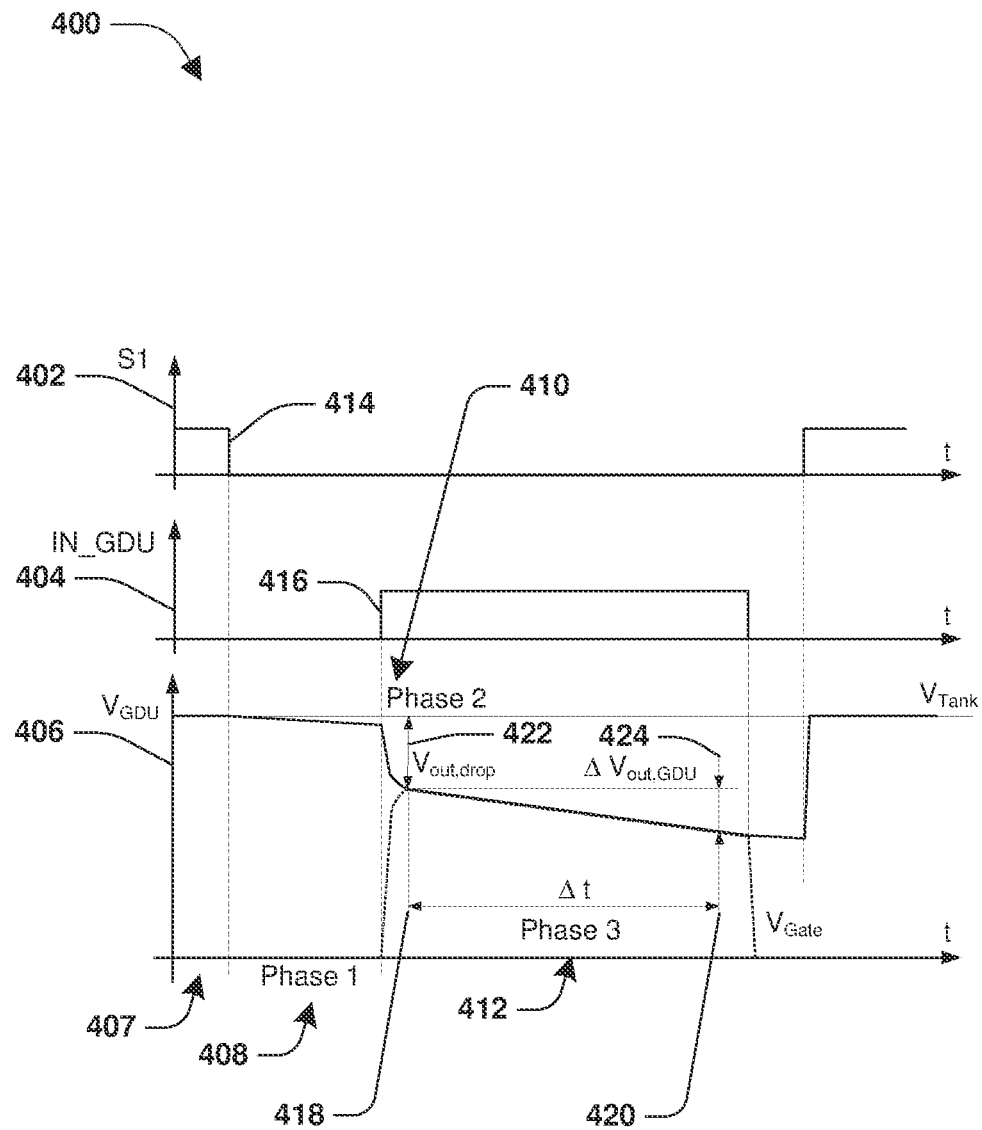
FIG. 4 is an illustration of a timing diagram associated with a gate charge and leakage measurement test sequence in accordance with at least some of the techniques presented herein.

FIG. 4 is an illustration of a timing diagram 400 associated with a gate charge and leakage measurement test sequence in accordance with at least some of the techniques presented herein. S1 402 represents a state of the switch (S1) 106 either being turned on or off. IN_gdu 404 represents the input current (INgdu) for the gate driver 102. Vgdu 406 represents the voltage source (Vgdu) 108 for the gate driver 102. During an initial phase 407, the capacitor (Ctank) 104 is charged while the switch (S1) 106 is on, represented by signal 414 for S1 402. During a first phase 408, Vgdu 406 decreases because the switch (S1) 106 is turned off after the initial phase to disconnect the gate driver 102 from the voltage source (Vgdu) 108. During the first phase 408, the supply of the gate driver is disconnected, and a voltage decay from supply current of GDU is:

$$I_{GDU} = C_{Tank} \cdot \frac{dV_{Tank}}{dt}.$$

During a second phase 410, the input current (INgdu) 110 increases, as illustrated by signal 416 for IN_gdu 404. During the second phase 410, the gate driver will turn on the power device, and an initial voltage drop is representing QG: $Q_G = C_{Tank} \cdot V_{out,drop}$.

At the end of the second phase and just before the start 418 of a third phase 412, Vout,drop 422 is measured as a gate charge at the gate of the solid state device. At the end 420 of the third phase 412, a change in Vout,gdu 424 is measured, which may be used to determine a gate leakage current of the gate of the solid state device 118. When solid state device is in saturation, a voltage slope is representing the $I_{GDU}$ and the gate leakage current is:

$$I_{discharge} = I_{GDU} + I_{G,leakage} = C_{Tank} \cdot \frac{dV_{out,GDU}}{dt}.$$

An embodiment of the presently disclosed techniques includes an apparatus. The apparatus includes a switch; and a capacitor connected to the switch and to a gate driver configured to drive a gate of a solid state device, wherein the gate driver is operated to perform a test sequence for the solid state device, wherein: during an initial phase of the test sequence, the switch is turned on and the capacitor is charged to a supply voltage; during a first phase of the test sequence, the switch and the solid state device are turned off, the gate driver is disconnected from the supply voltage, and the gate driver drives the gate of the solid state device based at least upon a charge of the capacitor; and during a second phase of the test sequence, the gate driver drives the gate of the solid state device to turn on the solid state device, wherein a gate charge at the gate of the solid state device is measured as an operational state of the solid state device.

According to some embodiments, at least one of the switch is integrated into the gate driver or the switch is connected between a voltage source for the gate driver and a gate driver output supply pin.

According to some embodiments, during the second phase of the test sequence, the gate charge based is measured based upon a capacitance change of the capacitor after the solid state device has been switched, and wherein during a third phase of the test sequence, a gate leakage current of the gate is measured as the operational state based upon at least one of a change in an output voltage of the gate driver over time or the supply voltage of the gate driver.

According to some embodiments, during a third phase of the test sequence, a gate leakage current of the gate is measured as the operational state based upon a capacitance change of the capacitor.

According to some embodiments, during a third phase of the test sequence, a gate leakage current of the gate is measured as the operational state based upon a discharge capacitance proportional to the gate leakage current and a current of the gate driver.

According to some embodiments, a warning signal is generated based upon the operational state to indicate that the solid state device is operating in a degraded operational state.

According to some embodiments, a warning message is generated based upon the operational state to indicate a potential future failure of the solid state device.

According to some embodiments, the solid state device is part of a DC current carrying solid state component, and wherein the test sequence is performed during at least one of a power up or a power down cycle.

According to some embodiments, a gate leakage current of the gate is measured during a third phase of the test sequence.

According to some embodiments, the test sequence is performed during a zero-crossing of AC current detected by a current sensor.

According to some embodiments, the test sequence is performed for a pair of solid state devices.

According to some embodiments, the test sequence is performed in-situ during operation of the apparatus.

According to some embodiments, the apparatus includes a pair of solid state devices in parallel and including the solid state device, and wherein the test sequence is performed upon the pair of solid state devices to selectively detect a disconnection of the solid state device.

An embodiment of the presently disclosed techniques includes a method. The method includes charging a capacitor using a supply voltage while a switch is turned on; controlling a gate driver coupled to a gate of a solid state device to turn off the solid state device; turning off the switch after the capacitor has reached a charged condition, wherein the capacitor is connected to the gate driver and the switch; driving the solid state device with the gate driver based upon a charge of the capacitor while the solid state device and the switch are turned off and the gate driver is disconnected from the supply voltage during a first phase of a test sequence; turning on, during a second phase of the test sequence, the solid state device by driving the solid state device; and measuring, during the second phase while the solid state device is on, a gate charge of the gate of the solid state device as an operational state of the solid state device.

According to some embodiments, the measuring includes measuring the gate charge based upon a voltage drop of the capacitor.

According to some embodiments, the method includes measuring, during a third phase of the test sequence, a gate leakage current of the gate as the operational state based upon at least one of a change in an output voltage of the gate driver over time or the supply voltage of the gate driver.

According to some embodiments, the method includes generating a warning signal based upon the operational state to indicate that the solid state device is operating in a degraded operational state.

According to some embodiments, the method includes generating a warning message based upon the operational state to indicate a potential future failure of the solid state device.

An embodiment of the presently disclosed techniques includes an apparatus. The apparatus includes a solid state device; a switch connected between a voltage source for a gate driver and a gate driver output supply pin; a capacitor connected to the gate driver and the switch, wherein the capacitor is charged to a supply voltage while the switch is turned on; the gate driver configured to drive a gate of the solid state device, wherein a test sequence is performed by: performing a first phase of the test sequence wherein the solid state device is turned off and the gate driver drives the gate of the solid state device based at least upon a charge of the capacitor; performing a second phase of the test sequence wherein the switch is turned on and the gate driver drives the gate of the solid state device to turn on the solid state device, wherein a gate charge at the gate of the solid state device is measured as an operational state of the solid state device; and performing a third phase of the test sequence where a gate leakage current of the gate is measured as the operational state based upon a change in an output voltage of the gate driver over time.

According to some embodiments, a warning signal is generated based upon the operational state to indicate that the solid state device is operating in a degraded operational state.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An apparatus, comprising:
    a switch; and
    a capacitor connected to the switch and to a gate driver configured to drive a gate of a solid state device, wherein the gate driver is operated to perform a test sequence for the solid state device, wherein:
        during an initial phase of the test sequence, the switch is turned on and the capacitor is charged to a supply voltage;
        during a first phase of the test sequence, the switch and the solid state device are turned off, the gate driver is disconnected from the supply voltage, and the gate driver drives the gate of the solid state device based at least upon a charge of the capacitor, and
        during a second phase of the test sequence, the gate driver drives the gate of the solid state device to turn on the solid state device, wherein a gate charge at the gate of the solid state device is measured as an operational state of the solid state device.

2. The apparatus of claim 1, wherein at least one of the switch is integrated into the gate driver or the switch is connected between a voltage source for the gate driver and a gate driver output supply pin.

3. The apparatus of claim 1, wherein during the second phase of the test sequence, the gate charge based is measured based upon a capacitance change of the capacitor after the solid state device has been switched, and wherein during a third phase of the test sequence, a gate leakage current of the gate is measured as the operational state based upon at least one of a change in an output voltage of the gate driver over time or the supply voltage of the gate driver.

4. The apparatus of claim 1, wherein during a third phase of the test sequence, a gate leakage current of the gate is measured as the operational state based upon a capacitance change of the capacitor.

5. The apparatus of claim 1, wherein during a third phase of the test sequence, a gate leakage current of the gate is measured as the operational state based upon a discharge capacitance proportional to the gate leakage current and a current of the gate driver.

6. The apparatus of claim 1, wherein a warning signal is generated based upon the operational state to indicate that the solid state device is operating in a degraded operational state.

7. The apparatus of claim 1, wherein a warning message is generated based upon the operational state to indicate a potential future failure of the solid state device.

8. The apparatus of claim 1, wherein the solid state device is part of a DC current carrying solid state component, and wherein the test sequence is performed during at least one of a power up or a power down cycle.

9. The apparatus of claim 1, wherein a gate leakage current of the gate is measured during a third phase of the test sequence.

10. The apparatus of claim 1, wherein the test sequence is performed during a zero-crossing of AC current detected by a current sensor.

11. The apparatus of claim 1, wherein the test sequence is performed for a pair of solid state devices.

12. The apparatus of claim 1, wherein the test sequence is performed in-situ during operation of the apparatus.

13. The apparatus of claim 1, wherein the apparatus comprises a pair of solid state devices in parallel and including the solid state device, and wherein the test sequence is performed upon the pair of solid state devices to selectively detect a disconnection of the solid state device.

14. A method, comprising:
    charging a capacitor using a supply voltage while a switch is turned on;
    controlling a gate driver coupled to a gate of a solid state device to turn off the solid state device;
    turning off the switch after the capacitor has reached a charged condition, wherein the capacitor is connected to the gate driver and the switch;
    driving the solid state device with the gate driver based upon a charge of the capacitor while the solid state device and the switch are turned off and the gate driver is disconnected from the supply voltage during a first phase of a test sequence;
    turning on, during a second phase of the test sequence, the solid state device by driving the solid state device; and
    measuring, during the second phase while the solid state device is on, a gate charge of the gate of the solid state device as an operational state of the solid state device.

15. The method of claim 14, wherein measuring comprises measuring the gate charge based upon a voltage drop of the capacitor.

16. The method of claim 14, comprising:
measuring, during a third phase of the test sequence, a gate leakage current of the gate as the operational state based upon at least one of a change in an output voltage of the gate driver over time or the supply voltage of the gate driver.

17. The method of claim 14, comprising:
generating a warning signal based upon the operational state to indicate that the solid state device is operating in a degraded operational state.

18. The method of claim 14, comprising:
generating a warning message based upon the operational state to indicate a potential future failure of the solid state device.

19. An apparatus, comprising:
a solid state device;
a switch connected between a voltage source for a gate driver and a gate driver output supply pin;
a capacitor connected to the gate driver and the switch, wherein the capacitor is charged to a supply voltage while the switch is turned on;
the gate driver configured to drive a gate of the solid state device, wherein a test sequence is performed by:
performing a first phase of the test sequence wherein the solid state device is turned off and the gate driver drives the gate of the solid state device based at least upon a charge of the capacitor;
performing a second phase of the test sequence wherein the switch is turned on and the gate driver drives the gate of the solid state device to turn on the solid state device, wherein a gate charge at the gate of the solid state device is measured as an operational state of the solid state device; and
performing a third phase of the test sequence where a gate leakage current of the gate is measured as the operational state based upon a change in an output voltage of the gate driver over time.

20. The apparatus of claim 19, wherein a warning signal is generated based upon the operational state to indicate that the solid state device is operating in a degraded operational state.

* * * * *